United States Patent
Bankman et al.

(10) Patent No.: US 6,844,768 B2
(45) Date of Patent: Jan. 18, 2005

(54) DYNAMIC METHOD FOR LIMITING THE REVERSE BASE-EMITTER VOLTAGE

(75) Inventors: Jesse R. Bankman, Jamaica Plain, MA (US); Kimo Y. F. Tam, Lincoln, MA (US)

(73) Assignee: Analog Devices, Inc., Norwood, MA (US)

( * ) Notice: Subject to any disclaimer, the term of this patent is extended or adjusted under 35 U.S.C. 154(b) by 52 days.

(21) Appl. No.: 10/441,744

(22) Filed: May 19, 2003

(65) Prior Publication Data

US 2004/0232968 A1 Nov. 25, 2004

(51) Int. Cl.[7] .................................................. H03K 5/08
(52) U.S. Cl. ........................ 327/312; 327/316; 327/318; 327/390
(58) Field of Search ................................. 327/309, 312, 327/313, 315, 316, 318, 321, 331, 390, 589

(56) References Cited

U.S. PATENT DOCUMENTS

| | | | |
|---|---|---|---|
| 4,333,120 A | | 6/1982 | Kotowski |
| 4,870,533 A | | 9/1989 | Bahlmann |
| 5,235,216 A | * | 8/1993 | Cook et al. ............. 327/530 |
| 5,640,127 A | | 6/1997 | Metz |
| 5,973,561 A | | 10/1999 | Heaton |

* cited by examiner

Primary Examiner—Kenneth B. Wells
(74) Attorney, Agent, or Firm—Wolf, Greenfield & Sacks, P.C.

(57) ABSTRACT

In a circuit having two input stages multiplexed to a common output stage having an output, one of the two input stages including transistor having a base, a collector and an emitter; a method of protecting the transistor from $\mu$-degradation when the one of the two input stages is disabled comprises: clamping the base to a substantially fixed voltage for a first range of voltages applied to the one of the two input stages; and bootstrapping the base to a voltage that follows the output for a second range of voltages applied to the one of the two input stages. Alternatively, a method of protecting a transistor having a base connected through a finite impedance to an input voltage, a collector and an emitter, may comprise bootstrapping the base to a voltage that follows the input voltage with an offset when the input voltage is within a second range of voltages. A circuit having an input voltage connected thereto through a finite impedance may comprise: a transistor having a base, a collector and an emitter; a comparator having a comparator output and having an input connected between the base and the input voltage; a clamping circuit having an output connected to the base and an input connected through a series resistance to a clamping reference voltage; and a bootstrapping circuit responsive to the comparator output, the bootstrapping circuit having an output that injects a variable current into the series resistance, altering the behavior of the clamping circuit from a fixed voltage clamp to a follower.

19 Claims, 14 Drawing Sheets

SIMPLIFY BY SHARING:
  $Ub_1$ WITH $Ub_3$
  $Ub_2$ WITH $Ub_4$
SIMPLIFY Vx, Vy GENERATION
BY REFERENCING Vx AND Vy
TO A MASTER VOLTAGE, $V_{CLAMP}$

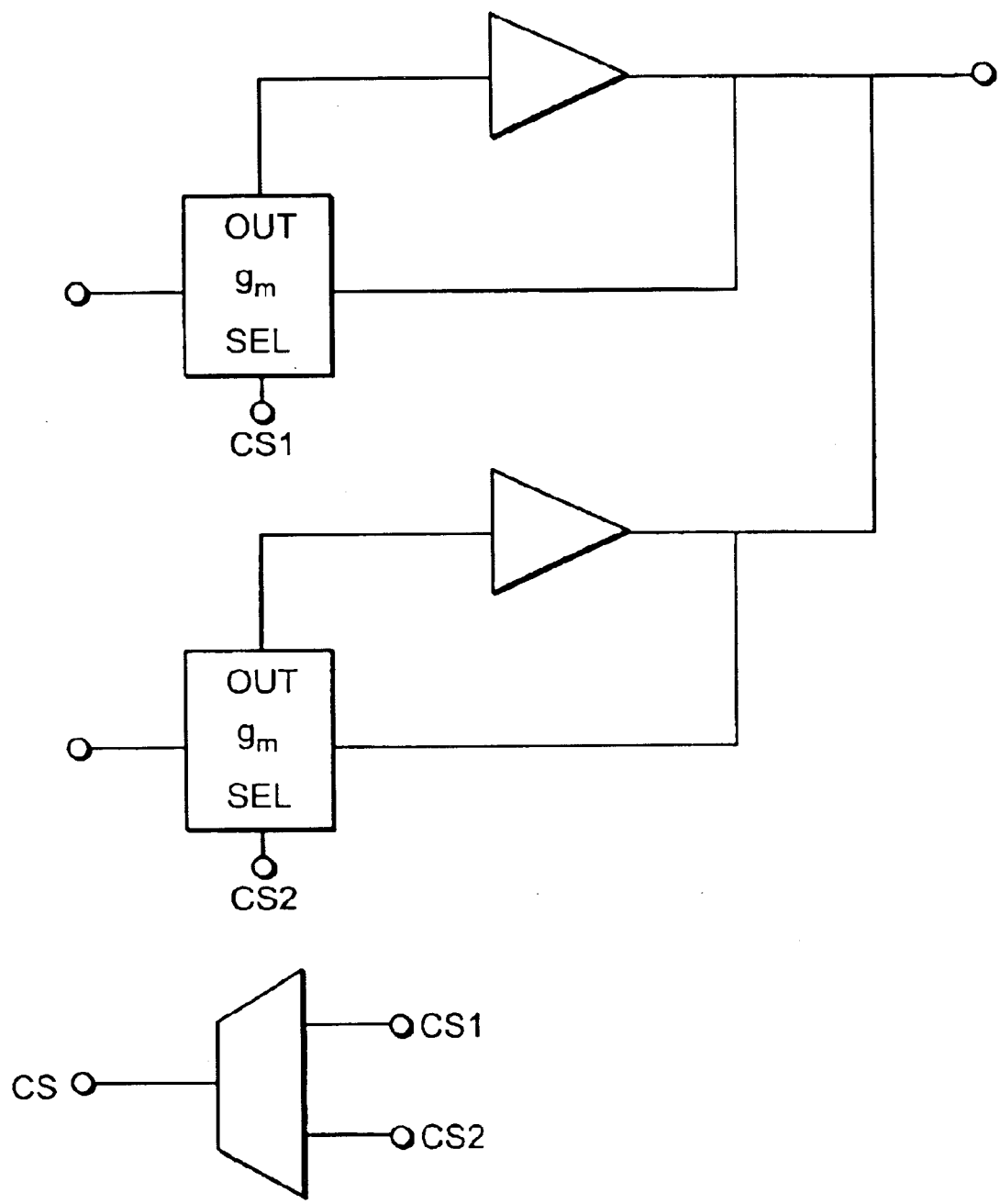
FIG. IB

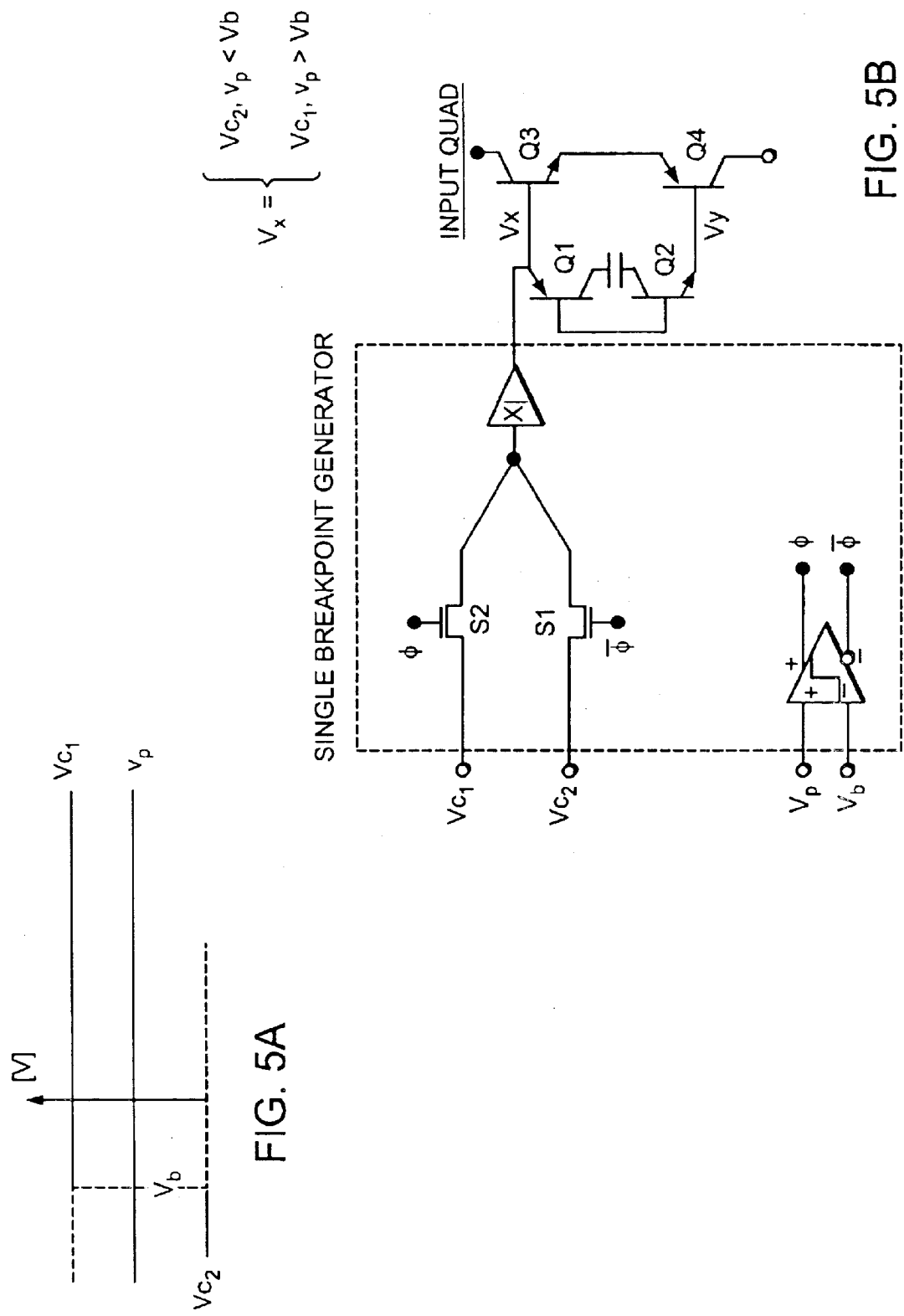

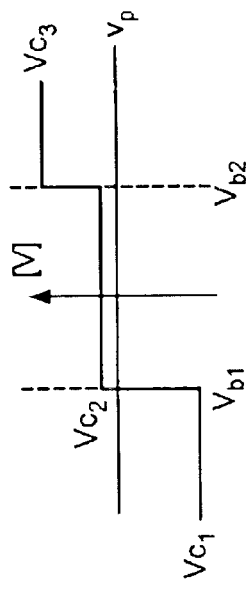
FIG. 6A
$$V_x = \begin{cases} V_{c_1}, & v_p < V_{b_1} \\ V_{c_2}, & V_{b_1} < v_p < V_{b_2} \\ V_{c_3}, & v_p < V_{b_2} \end{cases}$$
NOTE: THE FOLLOWING DENOTES AN IDEAL SWITCH ELEMENT THAT IS CLOSED WHEN GATE = TRUE (+) AND OPEN WHEN GATE = (–) FALSE.
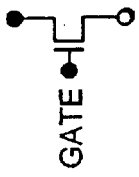
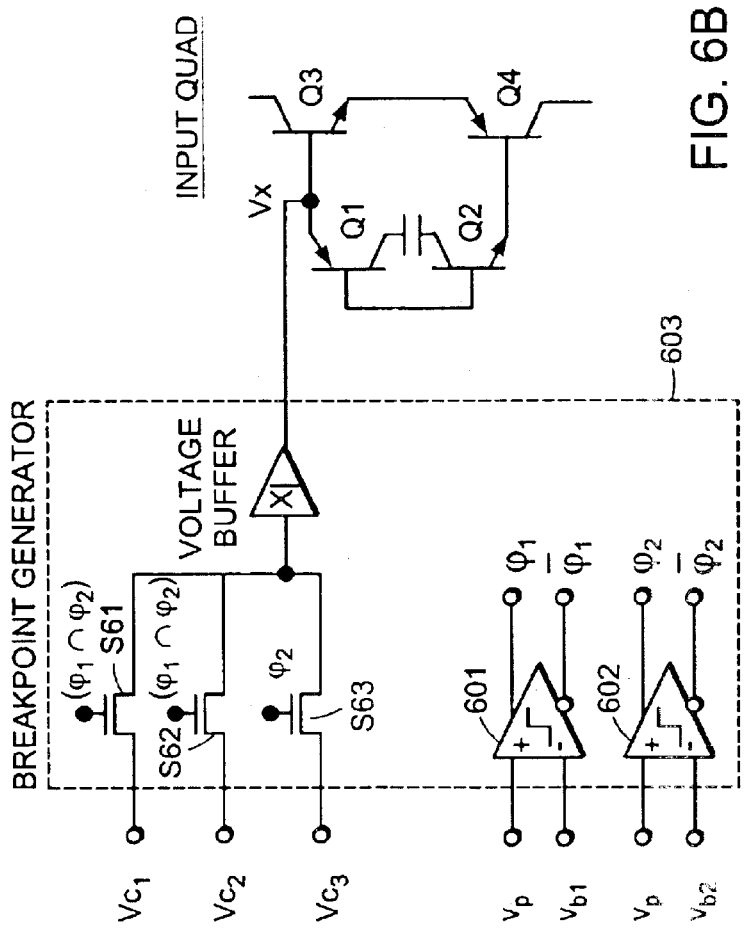
FIG. 6B SIMPLIFY BY SHARING:
  $U_{b1}$ WITH $U_{b3}$
  $U_{b2}$ WITH $U_{b4}$ SIMPLIFY Vx, Vy GENERATION
BY REFERENCING Vx AND Vy
TO A MASTER VOLTAGE, $V_{CLAMP}$

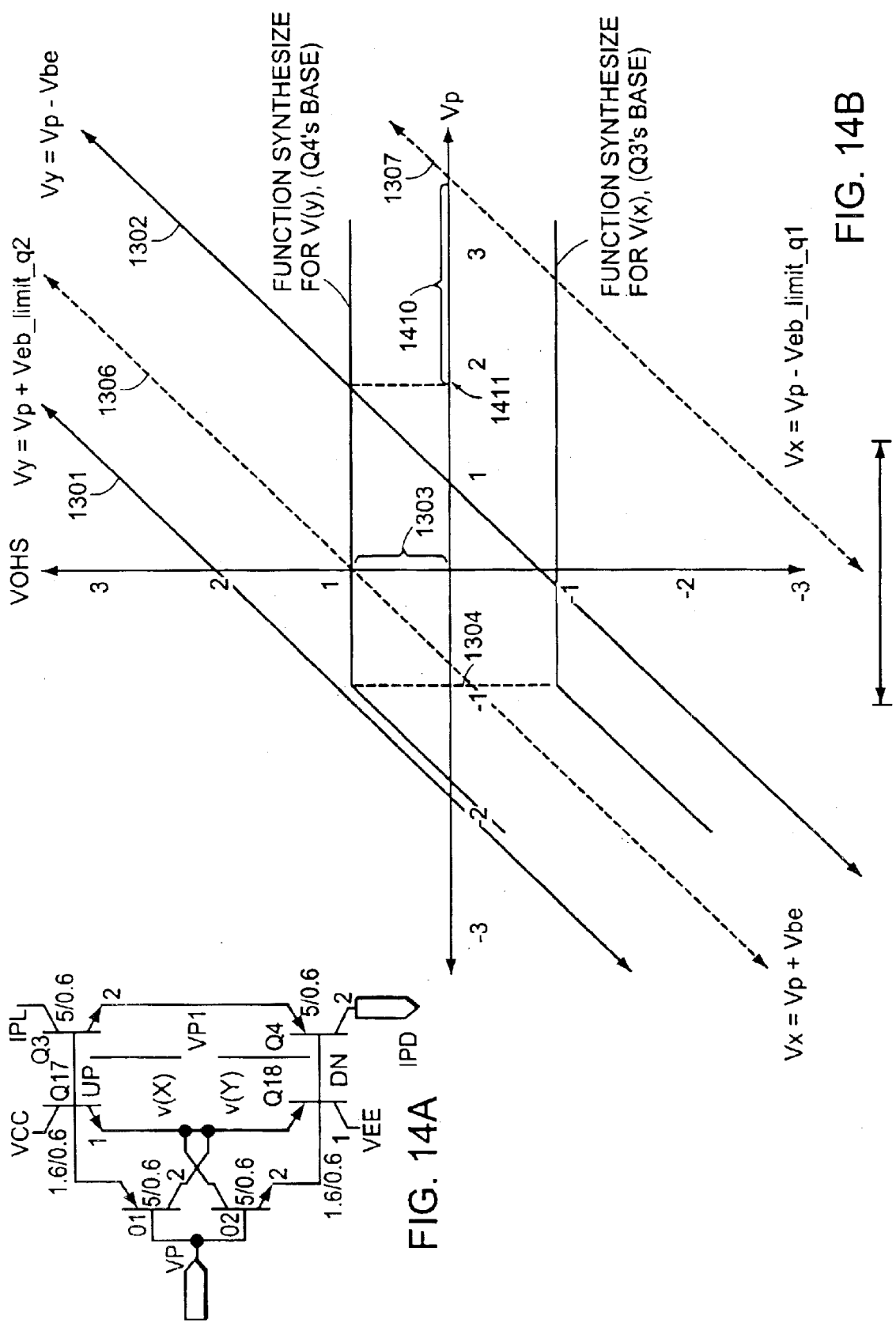

DYNAMIC METHOD FOR LIMITING THE REVERSE BASE-EMITTER VOLTAGE

BACKGROUND OF INVENTION

This application relates generally to circuits for protecting transistors from adverse applied voltages. In particular, the application relates to protection of bipolar transistors from excess reverse $V_{be}$ voltages, including those resulting in $\mu$-degradation over time.

The phenomenon of $\mu$-degradation is a response of a bipolar transistor to a stress. A bipolar transistor is a three-terminal amplifying device, whose terminals are referred to as the base, the collector and the emitter. There are junctions between the materials of which the base and collector are formed and between the materials of which the base and emitter are formed. The amount of gain, i.e. how large is the amplifying factor of the device, is called $\mu$, hence degradation of the gain in response to a stress is called $\mu$-degradation.

The phenomenon of $\mu$-degradation occurs when a bipolar transistor is stressed by a reverse $V_{be}$ voltage in a range between zero volts and the reverse breakdown voltage of the base-emitter junction of the bipolar transistor. When reverse-biased with a voltage between zero and a voltage at which reverse breakdown, i.e., zener breakdown, occurs, a transistor junction will exhibit a small reverse leakage current. This reverse leakage current or reverse conduction causes hot carrier induced oxide damage to the oxide overlying the junction, resulting in $\mu$-degradation and increased noise. Hot carrier induced oxide damage results in electron migration into the oxide, creating undesired additional current paths, reducing breakdown voltage and causing the increase in noise. The range of voltages for which $\mu$-degradation occurs and the range of voltages for which operation is considered to be normal is dependent on the process used to manufacture the bipolar transistor.

Although many circuit designs do not produce voltages across the base-emitter junction, $V_{be}$, that result in $\mu$-degradation, there are other circuits for which this problem will occur during normal circuit operation. One example of such a circuit is the video multiplexer circuit shown in FIG. 1A. Another example is shown in FIG. 1B. Although aspects of embodiments of the invention will be described as they apply to the circuit of FIG. 1A, and both FIGS. 1A and 1B are feedback connections, it will be seen that embodiments of aspects of the invention are not so limited.

The transconductance multiplexer of FIG. 1A includes a first transconductance input amplifier 101 and a second transconductance input amplifier 102 whose outputs are combined at summing junction 103 and converted to an output voltage vo by amplifier 104. The output voltage vo is fed back to inputs VNA and VNB of input transconductance amplifiers 101 and 102, respectively.

Each input transconductance amplifier 101 and 102 is a differential transistor amplifier. Conventionally, a differential transistor amplifier comprises a differential pair of bipolar transistors, tied at the emitters to a current source, the differential pair steering current through the collectors of the differential pair to one leg or the other of the circuit depending on the differential input voltage. A differential transistor amplifier could also be constructed using other transistor types, such as JFETs, MOSFETs, etc. At the point in time shown, input transconductance amplifier 101 is enabled by current source 105 while input transconductance amplifier 102 is disabled by current source 106. At other points in time, input transconductance amplifier 101 could be disabled by current source 105 and input transconductance amplifier 102 could be enabled by current source 106, or both input transconductance amplifiers 101 and 102 could be disabled by their respective current sources 105 and 106. Because of the feedback connection, which renders the combination of amplifier 104 and enabled input transconductance amplifier 101 a voltage follower, a voltage substantially equal to input voltage va applied to terminal VPA of input transconductance amplifier 101 is produced as the output voltage vo. However, the input to the second input transconductance amplifier 102, vb, applied to input terminal VPB of disabled input transconductance amplifier 102 is independent of, and may be substantially different from, output voltage vo.

A different feedback path is active in the circuit of FIG. 1B, but the result that the inputs to at least one transconductance amplifier input stage are far apart remains the same. Indeed, in transconductance stages including a differential pair, regardless of what mechanism causes the inputs to be very different, the fact that they are different causes the problem discussed.

FIG. 2 is a schematic of one of the amplifiers 101 and 102. It can be seen from this schematic that the large voltage between the input terminals VPB and VNB of input transconductance amplifier 102 may be large enough to substantially stress the transistors comprising the differential circuit of input transconductance amplifier 102. For example, if the voltage at VN is brought to a high level, say +1.5 V for example, while the voltage at VP is brought to a low level, say −1.5 V for example, then the 3 V input is distributed across transistors Q7 and Q5 in parallel with transistors Q8 and Q6, RD, and transistors Q3 and Q1 in parallel with transistors Q4 and Q2, principally as a reverse $V_{be}$ on transistors Q7, Q6, Q3 and Q2.

SUMMARY OF INVENTION

In a circuit having two input stages multiplexed to a common output stage having an output, one of the two input stages including transistor having a base, a collector and an emitter; a method of protecting the transistor from $\mu$-degradation when the one of the two input stages is disabled comprises: clamping the base to a substantially fixed voltage for a first range of voltages applied to the one of the two input stages; and bootstrapping the base to a voltage that follows the output for a second range of voltages applied to the one of the two input stages. The method may further comprise applying a reference voltage through a series resistance to a buffer amplifier having an output connected to the base. The method may yet further comprise injecting a current into the series resistance, the injected current proportional to the voltage applied to the one of the two input stages. The method may even yet further comprise providing the series resistance by simulating a large resistor using an operational transconductance amplifier. Alternatively, the method may further comprise defining the first range of voltages and the fixed voltage so a reverse Vbe of the transistor never exceeds a voltage at which $\mu$-degradation is observable.

Alternatively, a method of protecting a transistor having a base connected through a finite impedance to an input voltage, a collector and an emitter, may comprise bootstrapping the base to a voltage that follows the input voltage with an offset when the input voltage is within a second range of voltages. This method may further comprise applying a reference voltage through a series resistance to a buffer amplifier having an output connected to the base. This method may yet further comprise injecting a current into the series resistance, the injected current proportional to the voltage applied to the one of the two input stages. This method may even yet further comprise providing the series resistance by simulating a large resistor using an operational transconductance amplifier. Alternatively, this method may further comprise defining the first range of voltages and the fixed voltage so a reverse $V_{be}$ of the transistor never exceeds a voltage at which $\mu$-degradation is observable.

A circuit having an input voltage connected thereto through a finite impedance may comprise: a transistor having a base, a collector and an emitter; a comparator having a comparator output and having an input connected between the base and the input voltage; a clamping circuit having an output connected to the base and an input connected through a series resistance to a clamping reference voltage; and a bootstrapping circuit responsive to the comparator output, the bootstrapping circuit having an output that injects a variable current into the series resistance, altering the behavior of the clamping circuit from a fixed voltage clamp to a follower. The circuit may further comprise an operational transconductance amplifier connected to provide the series resistance. The circuit may yet further comprise a transconductance amplifier that produces the variable current; and a current mirror operatively connected to mirror the variable current into the series resistance.

BRIEF DESCRIPTION OF DRAWINGS

In the drawings, each identical or nearly identical component that is illustrated in various figures is represented by a like numeral. For purposes of clarity, not every component may be labeled in every drawing. In the drawings:

FIG. 1B is a block diagram of another circuit with input transconductance amplifiers illustrating $\mu$-degradation;

FIG. 5 is a circuit block diagram of one embodiment of aspects of the invention;

FIG. 6 is a circuit block diagram of another embodiment of aspects of the invention;

FIG. 14 is a graph of alternative transfer functions of the clamp/boot strap circuits of FIGS. 11 and 12, with only one break point in each transfer function.

DETAILED DESCRIPTION

Figure 1A:
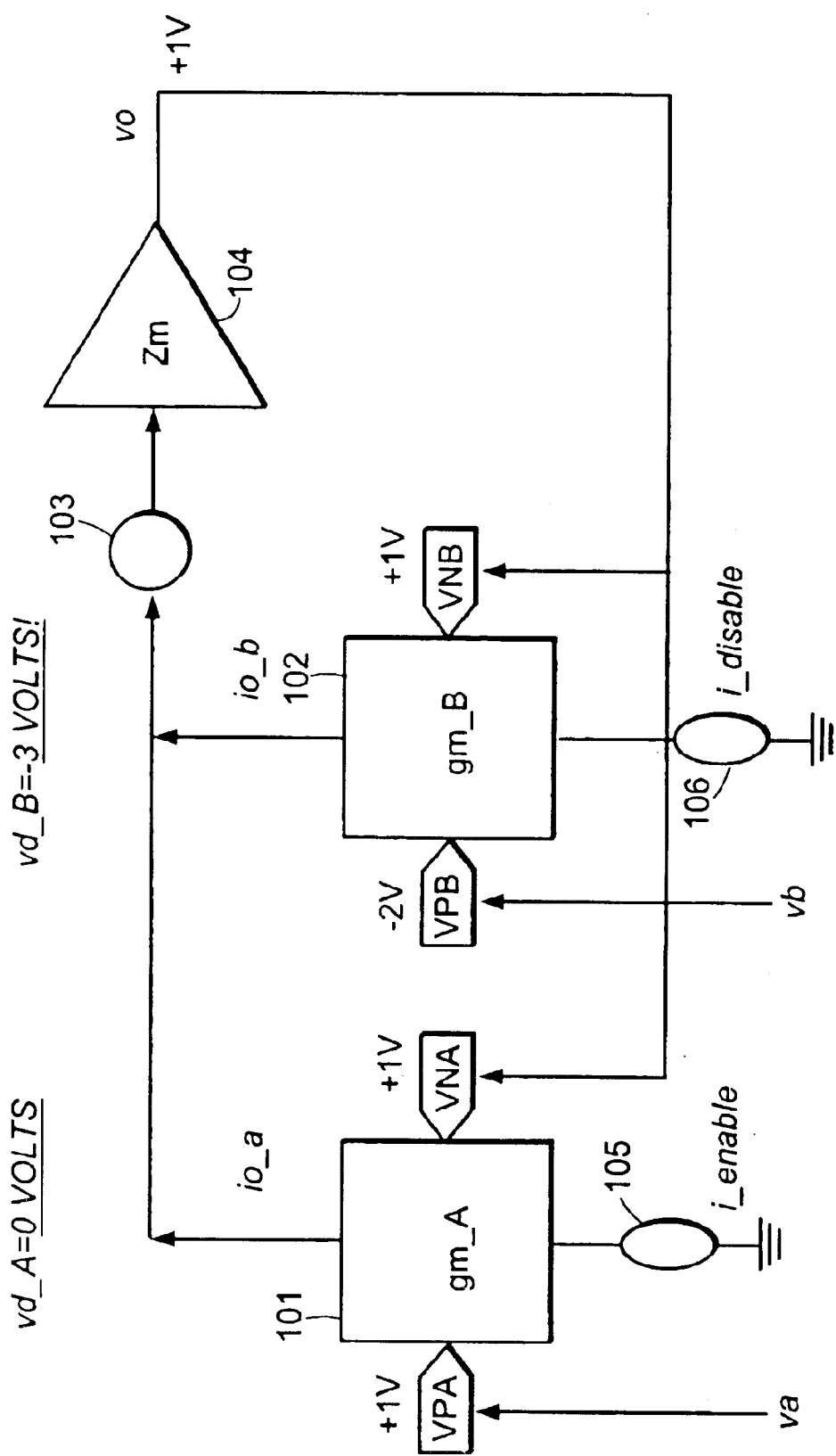
FIG. 1A is a block diagram of a switched input transconductance multiplexer, which will be used to illustrate the problem of $\mu$-degradation in a transistor and solutions thereto.

The present invention will be better understood upon reading the following detailed description of various embodiments of aspects thereof, taken in connection with the figures. The particular aspects and embodiments of the invention described relate to the two-input, transconductance multiplexer of FIG. 1A described in the background hereof. However, the invention is not limited to that application, as will be understood by those skilled in this art. Any transistor, for example those of the circuit of FIG. 1B and others, for which $\mu$-degradation may be a problem, used in a circuit for which the methods and circuits described are suitable can be protected by application of appropriate aspects of the invention. The circuits illustrated in FIGS. 1A and 1B are non-limiting examples, only. The number of parallel input blocks (e.g., FIG. 1A, input amplifiers 101 and 102) and the number of gain stages within each input block can be varied, including the use of two or more input blocks and two or more gain stages within each input block.

Briefly, with reference to FIG. 1A, the transconductance multiplexer through which the principles of aspects of embodiments of the invention will be illustrated includes a first transconductance input amplifier 101 and a second transconductance input amplifier 102 whose outputs are combined at summing junction 103 and converted to an output voltage vo by amplifier 104. The output voltage vo is fed back to inputs VNA and VNB of input transconductance amplifiers 101 and 102, respectively.

Each input transconductance amplifier 101 and 102 is a differential transistor amplifier. Conventionally, a differential transistor amplifier comprises a differential pair of bipolar transistors, tied at the emitters to a current source, the differential pair steering current through the collectors of the differential pair to one leg or the other of the circuit depending on the differential input voltage. A differential transistor amplifier could also be constructed using other transistor types, such as JFETs, MOSFETs, etc. Amplifiers 101 and 102 and their differential pairs are described in further detail, below. At the point in time shown, input transconductance amplifier 101 is enabled by current source 105 while input transconductance amplifier 102 is disabled by current source 106. At other points in time, input transconductance amplifier 101 could be disabled by current source 105 and input transconductance amplifier 102 could be enabled by current source 106, or both input transconductance amplifiers 101 and 102 could be disabled by their respective current sources 105 and 106. Because of the feedback connection, which renders the combination of amplifier 104 and enabled input transconductance amplifier 101 a voltage follower, a voltage substantially equal to input voltage va applied to terminal VPA of input transconductance amplifier 101 is produced as the output voltage vo. However, the input to the second input transconductance amplifier 102, vb, applied to input terminal VPB of disabled input transconductance amplifier 102 is independent of, and may be substantially different from, output voltage vo. Therefore, the voltage between the input terminals VPB and VNB of input transconductance amplifier 102 may be large enough to substantially stress the transistors comprising the differential circuit of input transconductance amplifier 102. This will be explained further in connection with FIG. 2.

Figure 2:
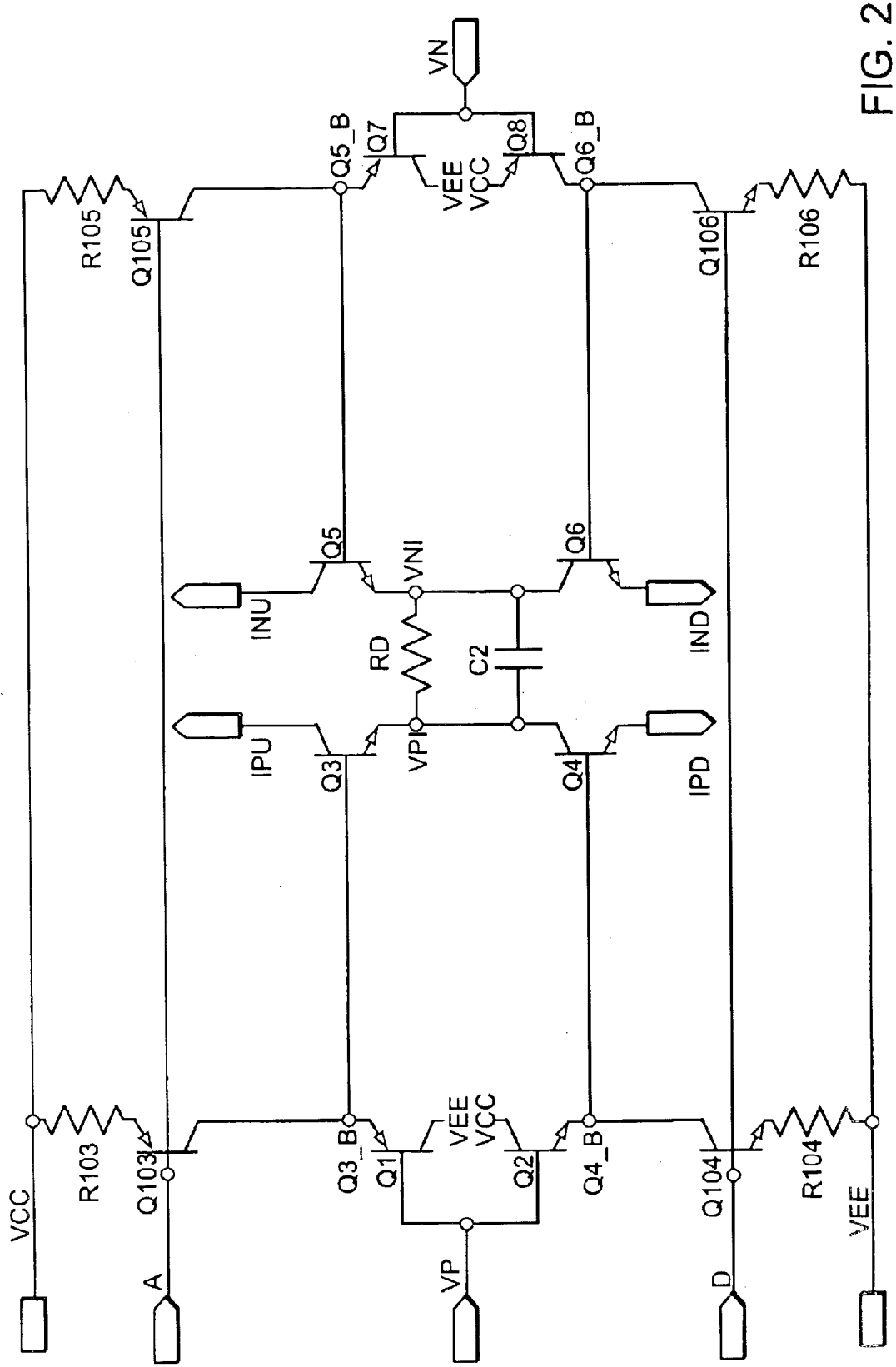
FIG. 2 is a simplified schematic of the disabled transconductance input stage of FIG. 1, in which the $\mu$-degradation problem arises and is solved.

The input transconductance amplifier illustrated in FIG. 2 and used as a non-limiting example to illustrate aspects of embodiments of the invention may be understood as two differential amplifiers, stacked one on the other. The top differential pair is formed by transistors Q3 and Q5. The bottom differential pair is formed by transistors Q4 and Q6. In the stacked configuration shown, the current sources that ordinarily supply current to the emitters of each differential pair have been set equal to each other. Therefore, they mathematically cancel out, and no current sources are required, or appear, in this portion of the illustrated circuit.

Transistor Q1, having its collector tied to $V_{EE}$ and biased by Q103, is a follower that level shifts the positive input voltage applied to terminal VP before it is applied to the base of Q3, so that the voltage at the emitter of Q3 tracks the voltage at the positive input VP. Likewise, Q2, having its collector tied to $V_{CC}$ and biased by Q104, is a follower that level shifts the voltage at the positive input VP that is applied to the base of Q4 so that the voltage at the emitter of Q4 is also made to track the voltage at the positive input terminal VP. Of course, the emitters of Q3 and Q4 are tied together at node VPI. A similar arrangement is constructed on the negative input side of the circuit, as follows. The input voltage applied to the negative input terminal VN is level shifted through follower transistors Q7 and Q8, having their collectors tied to $V_{EE}$ and $V_{CC}$ and biased by transistors Q105 and Q106, respectively. The resulting, level shifted input is then applied to the bases of transistors Q5 and Q6, respectively. The emitters of Q5 and Q6 thus carry a voltage that tracks the voltage at the negative input terminal VN. The difference between the voltage at the positive input terminal VP and the voltage at the negative input terminal VN is thus copied across resistor RD, thereby producing a current through the resistor RD proportional to the differential input voltage. That current is carried to the next stage of the multiplexer through terminals IPU, IPD, IMU and IND, where it shows up as a difference in currents between those terminals.

As shown in FIG. 1A, the voltage at input terminal VN is the output voltage vo, of the multiplexer. Thus, if the amplifier illustrated in FIG. 2 has been enabled (e.g., it represents input transconductance amplifier 101, FIG. 1A), then the voltage applied to input terminal VN (FIG. 1A, VNA) will closely track the voltage applied to input terminal VP (FIG. 1A, VPA). Therefore, all of the transistors of the enabled amplifier will be operating in the forward active regime.

An input-transconductance stage is considered "disabled" when the input to output DC transfer function of the stage is reduced to essentially zero. Disabling an input stage such as that illustrated in FIG. 2 may be effected by forcing all stage transistors into the cutoff regime for all allowable voltages at the stage's input(s). Disabling an input stage by forcing all transistors into the cutoff regime may reverse bias the base-emitter junction of one or more individual devices comprising the stage. Furthermore, individual devices may experience reverse $V_{be}$ stress for some subset of allowable input voltages. The transconductance stage shown in FIG. 2 may be disabled by reducing the voltage between the bases of Q3 and Q4 and the voltage between the bases of Q5 and Q6, to substantially less than two forward $V_{beS}$, respectively. Furthermore, the voltages at the bases of transistors Q3 through Q6 must be chosen so that transistors Q3 through Q6 remain in the cutoff regime. It is desirable to keep transistors Q1, Q2, Q7 and Q8 also operating in the cutoff regime.

If the amplifier illustrated in FIG. 2 is disabled (e.g., it represents input transconductance amplifier 102, FIG. 1A) then the input voltage applied to terminal VN (FIG. 1A, VNB) may be any valid input voltage for the circuit, while the input voltage applied to terminal VP (FIG. 1A, VPB) may be any other valid input voltage for the circuit. The difference between the voltages at terminals VP and VN may be as large as the full range of allowable input voltages, resulting in a substantial reverse base-emitter voltage, referred to herein as a reverse $V_{be}$, for at least some transistors in most practical circuits. The transistors that will be stressed in this manner may include one or more of transistors Q1, Q2, Q3, Q4, Q5, Q6, Q7 and Q8. Which transistor will see the stressor reverse $V_{be}$ depends upon the input voltages applied.

According to aspects of embodiments of the invention, it is desirable to modulate the voltage appearing on the emitter of one or more of the affected transistors as a function of the voltages applied to one or more of the input nodes. The function should be selected to minimize or eliminate operation in a voltage range causing μ-degradation. Functions that have been tried in the past include a simple clamp and a simple bootstrap. A simple clamp forces the emitter or another terminal of an affected transistor to a fixed voltage. By contrast, a simple bootstrap forces the emitter or another terminal of an affected transistor to track a signal, such as an input signal, to which the terminal is bootstrapped. A simple clamp does not permit a sufficiently wide range of input voltages for those same applications, but a simple bootstrap function permits an unacceptably high degree of cross talk for at least some applications. Thus, neither of these functions is acceptable.

The illustrative circuit of FIG. 2 includes inner, differential pairs of transistors and outer, emitter follower transistors. The circuit could alternatively include chains of plural emitter follower transistors in each location where one outer emitter follower is presently shown. The function applied to one or more of the emitters of the transistors of such a circuit should be selected to distribute the stress of a reverse $V_{be}$ sufficiently that no transistor of the claims, including the inner transistors suffers μ-degradation.

Figure 3:
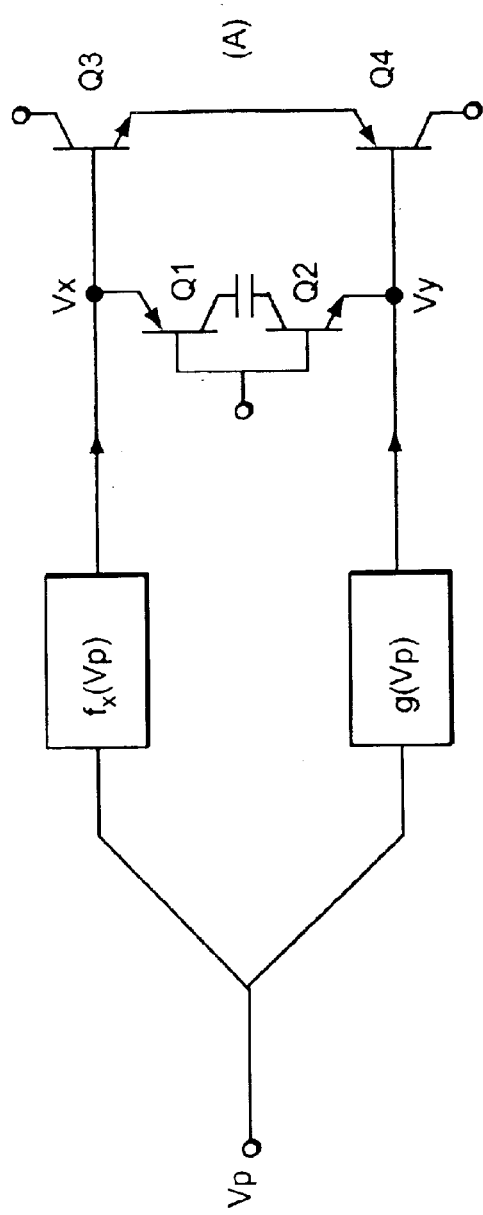
FIG. 3 is a functional block diagram of circuits added to the circuit of FIG. 2 according to some aspects of the invention.
Figure 4:
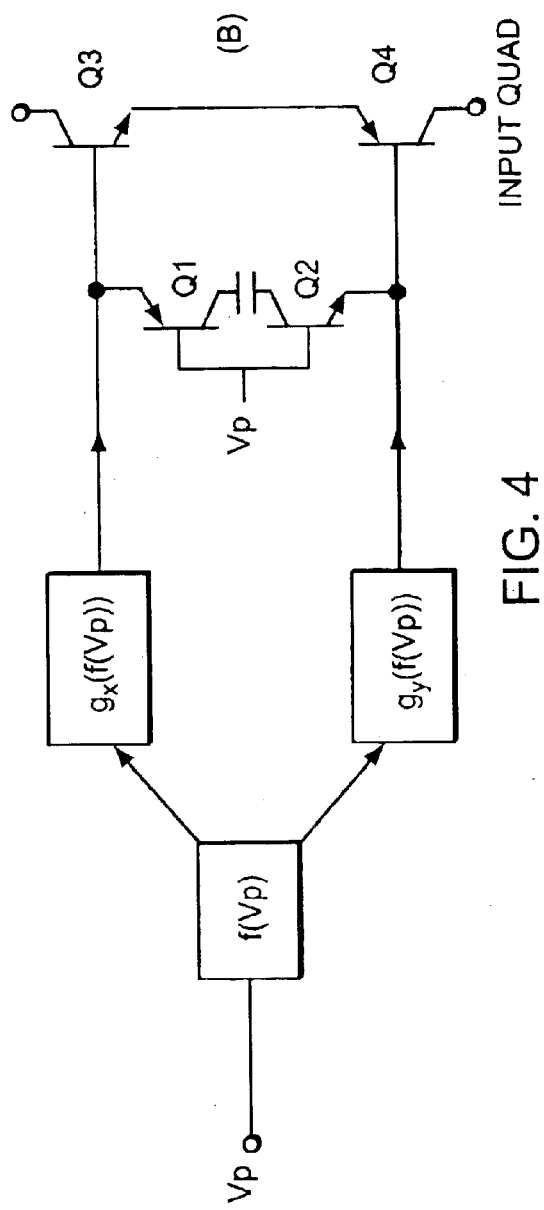
FIG. 4 is a functional block diagram of alternative circuits added to the circuit of FIG. 2 according to some aspects of the invention.

Therefore, as shown in FIGS. 3 and 4, according to various aspects of embodiments of the invention, circuits can be added to the transconductance amplifier stage illustrated in FIG. 2, to control the voltages at the emitter terminals of transistors Q1, Q2, Q7 and Q8, corresponding respectively to the base terminals of transistors Q3, Q4, Q5 and Q6. The functions of input voltage VP, f(VP) and g(VP), prevent significant signal transmission through the input transistors (FIG. 2; Q1, Q2, Q3 and Q4, for example), while also preventing any of the input transistors (FIG. 2; Q1, Q2, Q3, Q4, Q5, Q6, Q7, Q8) from entering an operating region in which μ-degradation or worse can occur. The functions f(VP) and g(VP) can be implemented directly, or can be decomposed into h(VP), f'(h(VP)) and g'(h(VP)), as shown in FIG. 4. This partition is advantageous for simplifying embodiments of aspects of the invention.

We now discuss how the functions illustrated in FIGS. 3 and 4 are achieved, referring to FIGS. 5–9.

FIG. 5 shows a circuit embodying aspect of the invention that produces a two-part transfer function, i.e. one having a single breakpoint. Switches S1 and S2 should be assumed to be ideal, wherein each switch closes when the gate signal is TRUE and opens when the gate signal is FALSE.

Another circuit embodying aspect of the invention, shown in FIG. 6, has two comparators 601, 602 and three switches S61, S62, S63, arranged in dual breakpoint generator 601 to produce a three-part transfer function, i.e. one having two breakpoints. Switch S61 is controlled by output φ₁ of comparator 601, while switch S63 is controlled by output φ₂ of comparator 602. Switch S62 is controlled by a combination (φ₁∩φ₂). Thus, voltage $V_x$ obeys the following equation:

$$V_x = \begin{cases} V_{C1} \forall\ v_p \leq v_{b1}, \\ V_{C2} \forall\ v_{b1} \leq v_p \leq v_{b2}, \text{ and} \\ V_{C3} \forall\ v_{b2} \leq v_p. \end{cases}$$

Figure 7A:
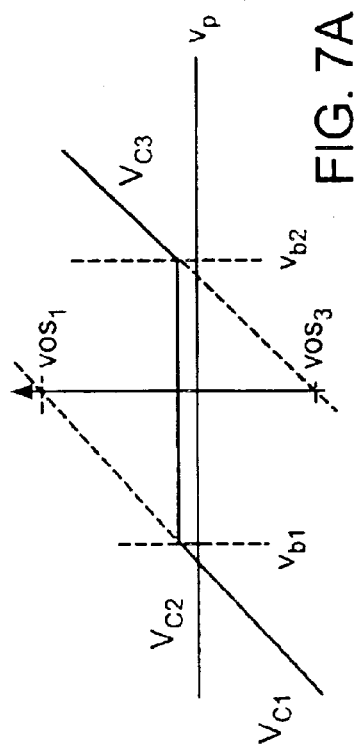
FIG. 7 is a circuit block diagram of an improvement to the topology of FIG. 6.
Figure 7B:
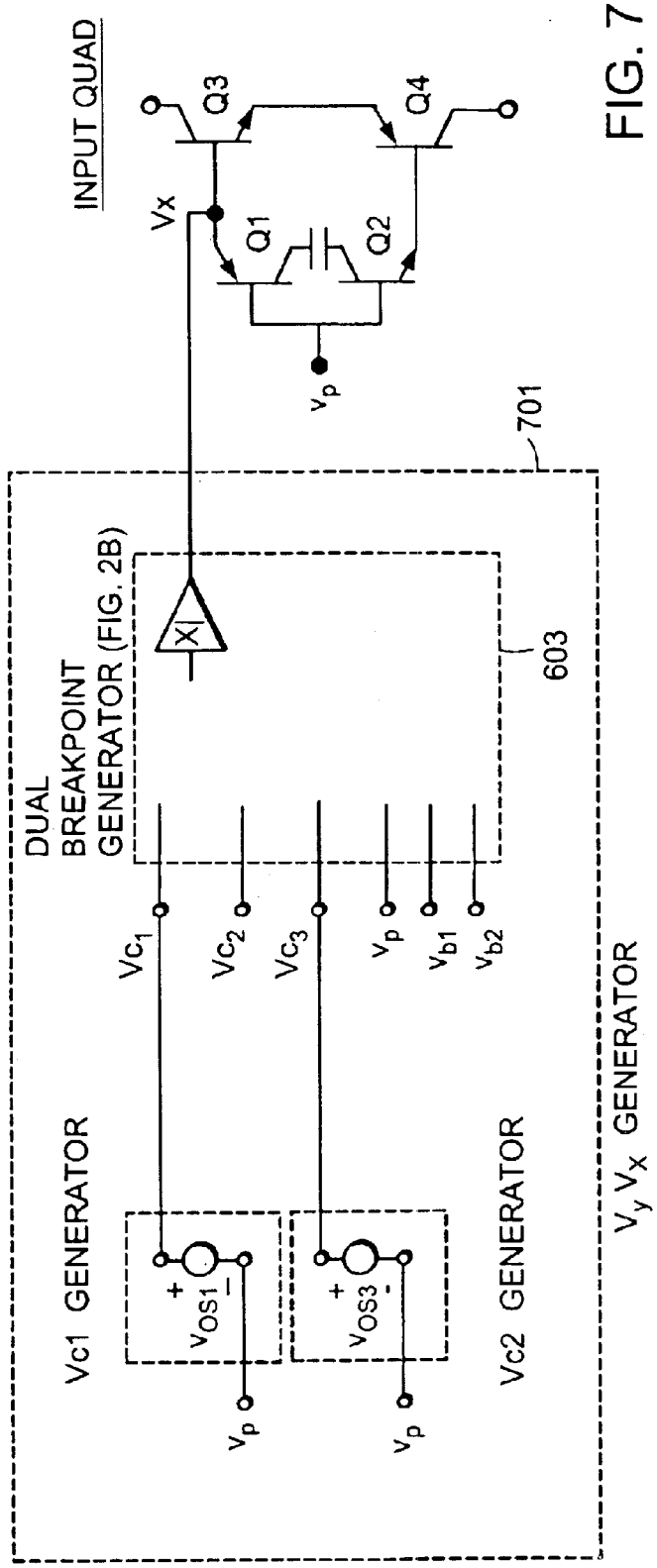

An improvement to the circuit of FIG. 6 is shown in FIG. 7. This circuit 701 uses offset voltages $v_{OS1}$ and $v_{OS3}$ to make inputs $V_{C1}$ and $V_{C3}$ proportional to but offset is from $v_p$. In order to reduce crosstalk, $V_{C2}$ is held constant. $V_{C1}$ and $V_{C3}$ are controlled to be proportional to $V_P$ in order to keep transistors Q1, Q2, Q3 and Q4 in a safe operating region.

Figure 8:
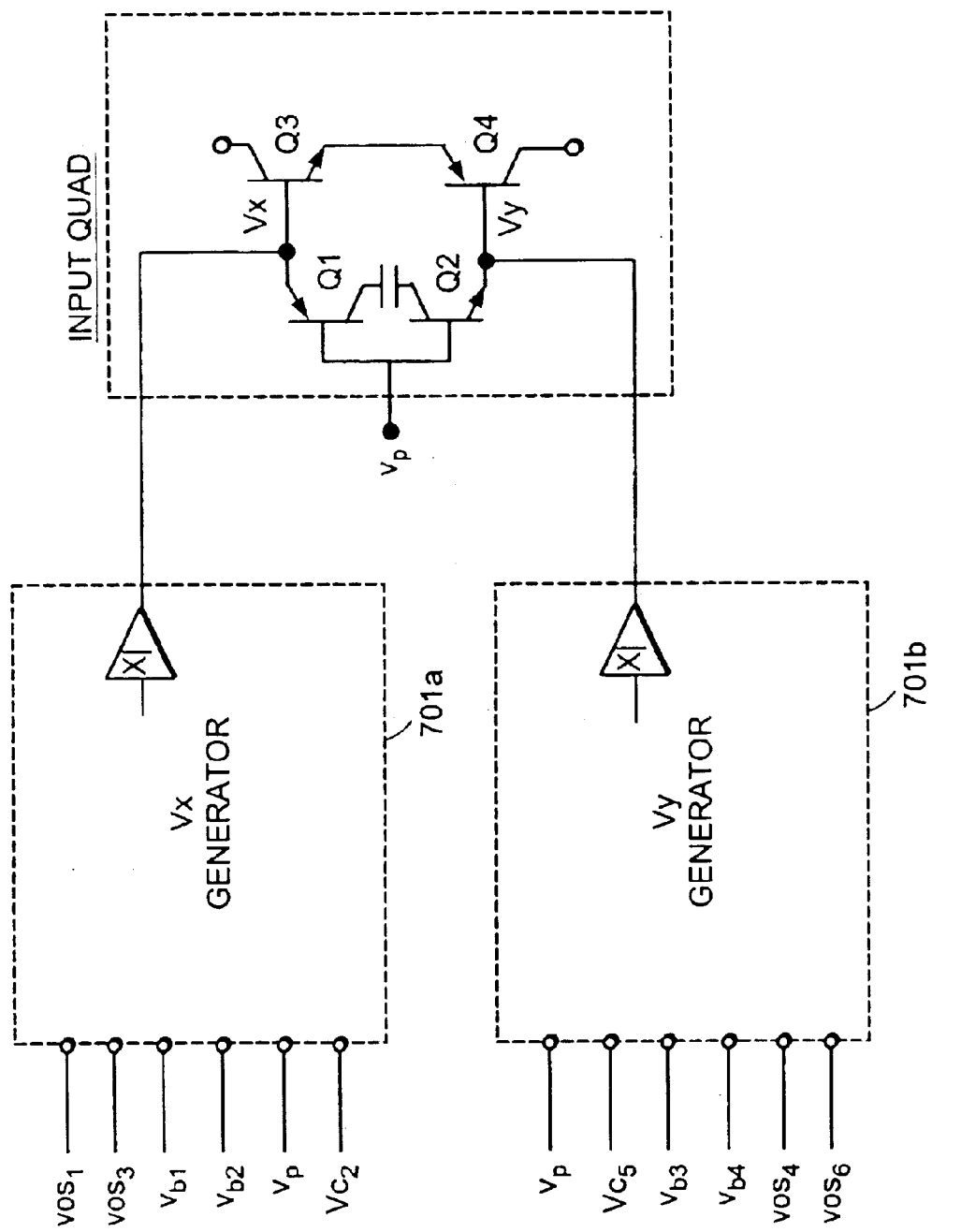
FIG. 8 is a circuit block diagram of a portion of the circuit of FIG. 2 with circuits as shown in FIG. 7 added.

Two copies 701a, 701b of the circuit 701 and concepts illustrated in FIG. 7 are used, as shown in FIG. 8, one circuit 701a to protect the upper transistors (FIG. 2, Q1 and Q3) and one circuit 701b to protect the lower transistors (FIG. 2, Q2 and Q3). The resulting transfer functions, in a general form, are shown in FIG. 9.

Figure 9:
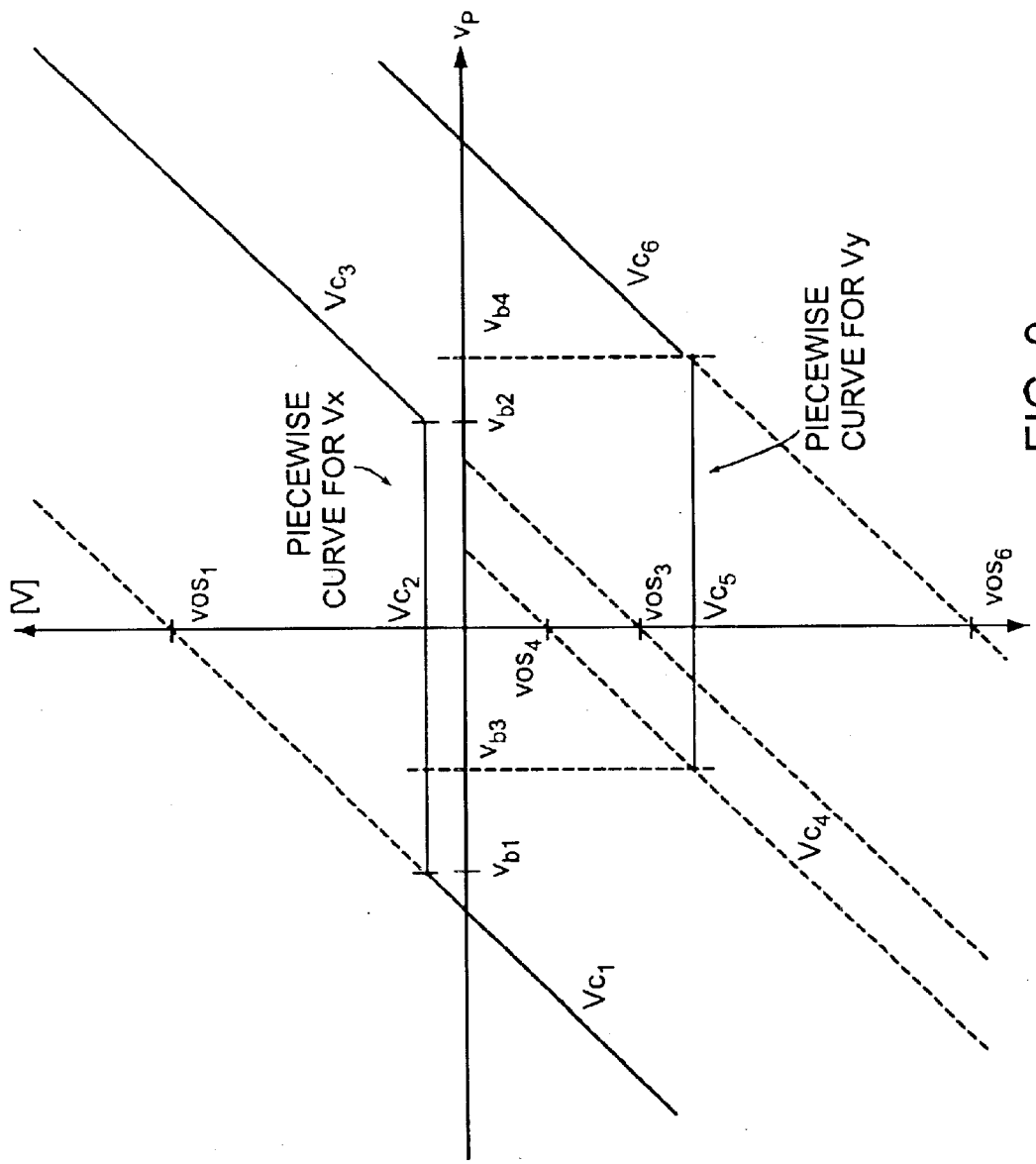
FIG. 9 is a graph of generic transfer functions realizable using aspects of embodiments of the invention.
Figure 10A:
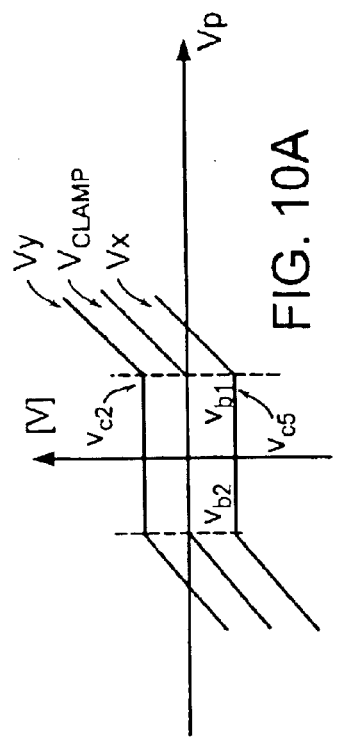
FIG. 10 is a circuit block diagram of an improvement to the circuit of FIG. 8.
Figure 10B:
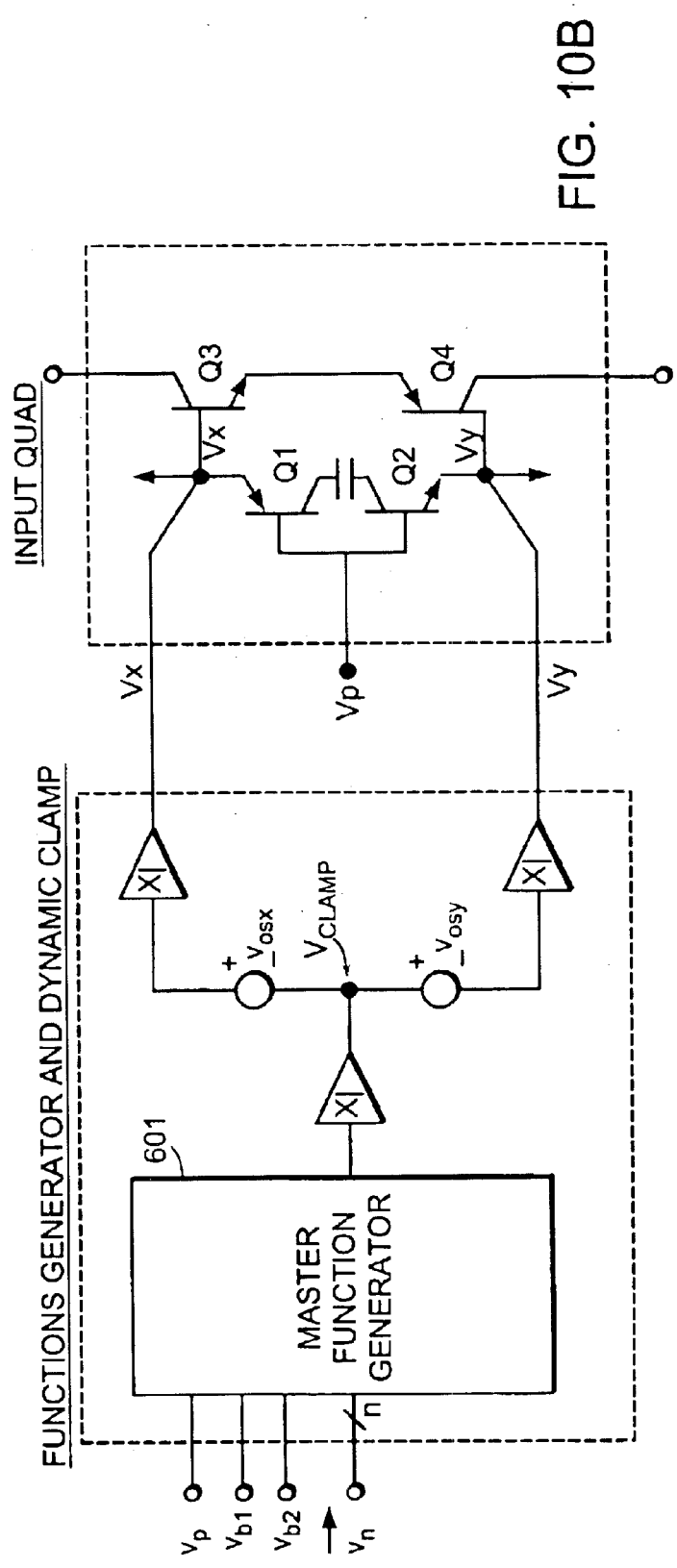

As shown by the circuit of FIG. 10, a simplification can be made wherein the four breakpoints of FIG. 9 are overlapped into two breakpoints. Only one master function generator circuit 601 is then needed.

Figure 11A:
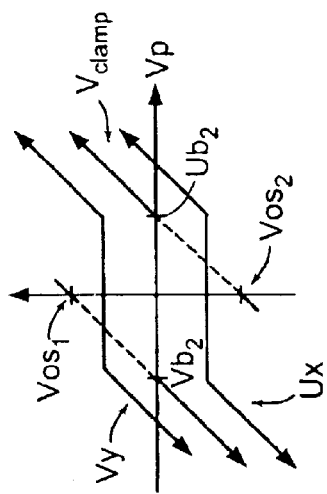
FIG. 11 is a detailed block diagram of the circuit of FIG. 10.
Figure 11B:
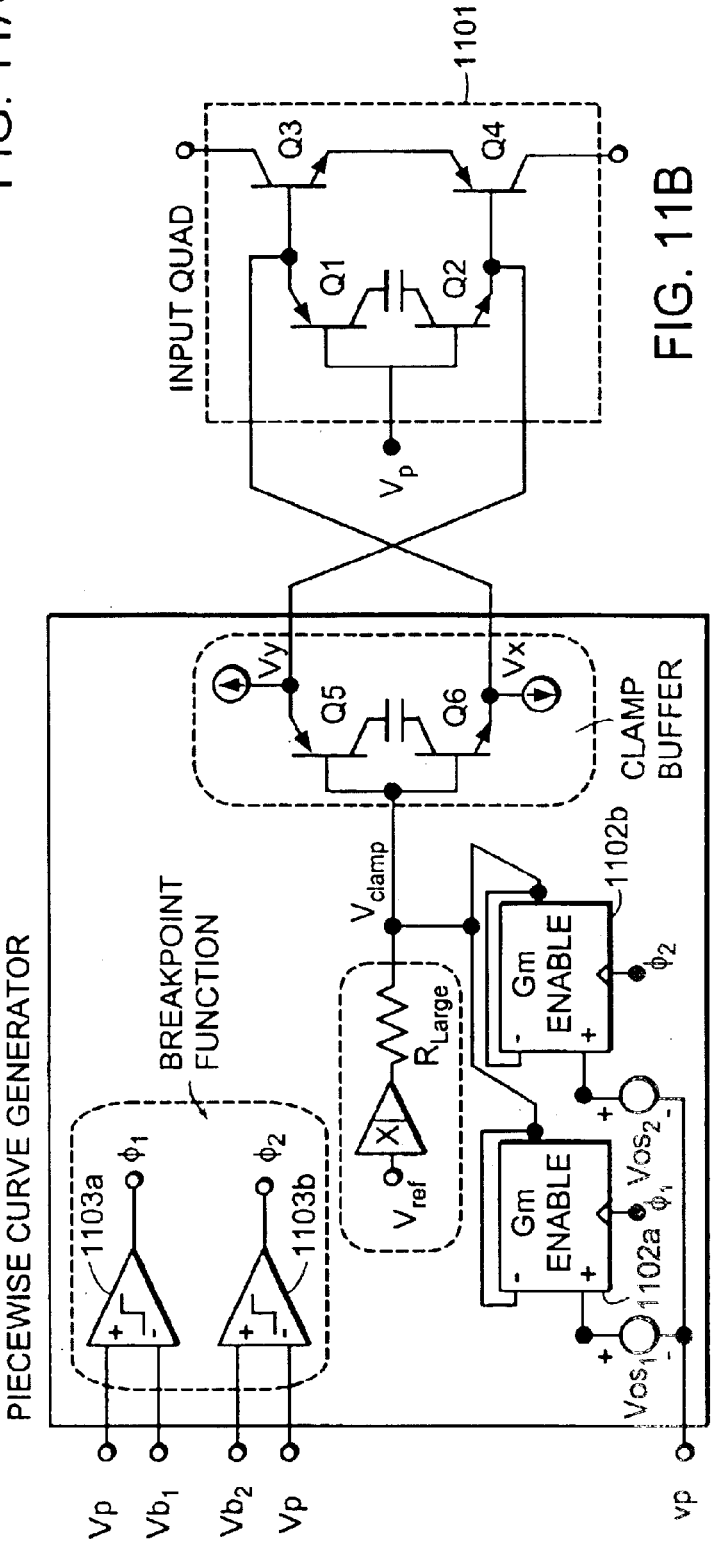

The topology illustrated in FIG. 10 is shown in more detail, in connection with a more specific embodiment, in FIG. 11. FIG. 11 shows just the positive input half 1101 of the differential transconductance amplifier. As will be understood by the skilled artisan, analogous circuits and principles are applied to the negative input side of the differential transconductance amplifier, if desired and circumstances permit. When the transconductance amplifier is disabled, a protection circuit having two modes is engaged. The protection circuit may receive a voltage $V_{ref}$ from a reference voltage source, and may include a large effective resistance $R_{large}$, operational transconductance amplifiers (OTAs) 1102a, 1102b, driven by input $V_P$ through offset voltages $V_{OS1}$ and $V_{OS2}$, and controlled by comparators 1103a, 1103b. When engaged in clamping mode, the protection circuit forces the bases of Q5 and Q6 to a voltage equal to $V_{ref}$. The output of the protection circuit can be varied, when in bootstrap mode, through OTAs 1102a and 1102b selected by enable signals φ₁ and φ₂. When in clamping mode, signals φ₁ and φ₂ deselect both OTAs, producing a constant, preferably zero, output current. When in bootstrapping mode, OTAs 1102a and 1102b produce an output current that varies with the input voltage vp.

Figure 12:
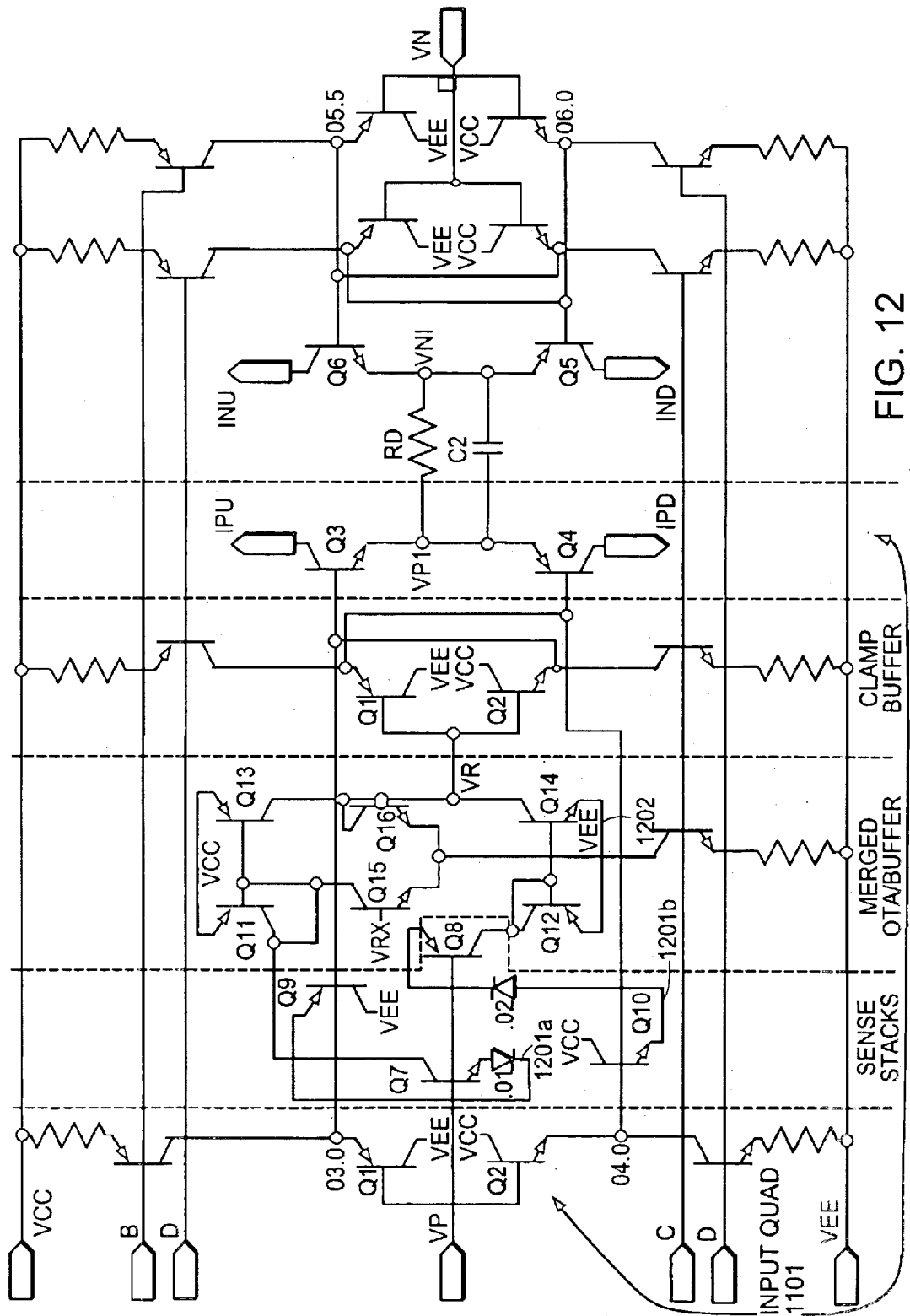
FIG. 12 is a more detailed circuit schematic of the circuit of FIG. 11.

The exemplary protection circuit of FIG. 11, shown in detail in FIG. 12, is configured to produce a transfer function, as explained in connection with FIG. 13, that clamps the bases of Q3 and Q4 over a range of input voltages near the center of the potential input voltage range, but which bootstraps the bases of Q3 and Q4 outside the center range. Other transfer functions are also possible, as also explained below. The bootstrap function is accomplished by injecting currents into the node carrying the voltage $V_{clamp}$ to cause it to track the input. As will be seen in the following more detailed description of FIG. 11, the functionality of comparators 1103a and 1103b, OTAs 1102a and 1102b and resistance 1101 can be repartitioned as sense stacks 1201a and 1201b and merged OTA and large effective resistance (LER) 1202.

During clamping mode, cross-talk is minimized because the clamp prevents the input of the disabled input transconductance amplifier from appearing across the inherent capacitance of transistors Q3 and Q4, which should be in an "off" state.

During bootstrap mode, any cross-talk is limited to the excess of the input voltage over the clamping range. Bootstrapping mode extends the protection range to the full range of potential input voltages.

The range of input voltages over which clamping mode extends can be centered within the range of permissible input voltages, with bootstrapping mode entered for voltages above the clamping mode range and for voltages below the clamping mode range. Alternatively, the clamping mode range can be offset to one side or another of the range of permissive input voltages, leaving a range of voltages for which bootstrapping mode is entered only on one side of the clamping range. Implementation of the latter design may be simpler than the former. However, the former design allows clamping mode to extend over the largest and most useful portion of the potential input voltage range.

The detailed circuit schematic of FIG. 12 is now described, while also referring back to FIG. 11, so that the circuit elements providing the functions of the block diagram of FIG. 11 can be readily seen.

The basic input transconductance amplifier positive input branch 1101 is comprised of transistors Q1, Q2, Q3 and Q4, as before. Transistors Q1 and Q2 are configured as followers. Transistor Q3 is one-half of a differential pair which together with Q5 (not shown) forms the top differential pair discussed above. Transistor Q4 is one-half of a differential pair which together with Q6 (not shown) forms the bottom differential pair discussed above. Differential pair Q15 and Q16 comprise merged OTA/LER 1202. One input to OTA/LER 1202 is voltage V₂ derived from reference voltage $V_{ref}$. Two current mirrors modify the output of OTA/LER 1202 depending upon mode, as discussed above. One current mirror is comprised of transistors Q11 and Q13, the other of transistors Q12 and Q14. The current mirror comprised of transistors Q11 and Q13 is arranged to increase the current output by OTA/LER 1202 by sourcing additional current into the output node, while the current mirror of transistors Q12 and Q14 is arranged to reduce the current output by OTA/LER 1202 by sinking excess current from the output node. The current mirrors are each controlled by a sense stack 1201a and 1201b, respectively. The sense stack 1201a controlling current mirror 1203a, comprised of transistors Q11 and Q13 includes input transistor Q7 biased by transistors Q9 and D1. Similarly, sense stack 1201b controlling current mirror 1203b is comprised of input transistor Q8 biased by transistor Q10 and D2. Any other suitable passive or active threshold circuit could be used in place of the sense stacks shown, provided it performs the desired threshold function. For example, under some circumstances, a diode may suffice to provide the threshold function, or a more complex circuit may provide advantageous characteristics.

Figure 13B:
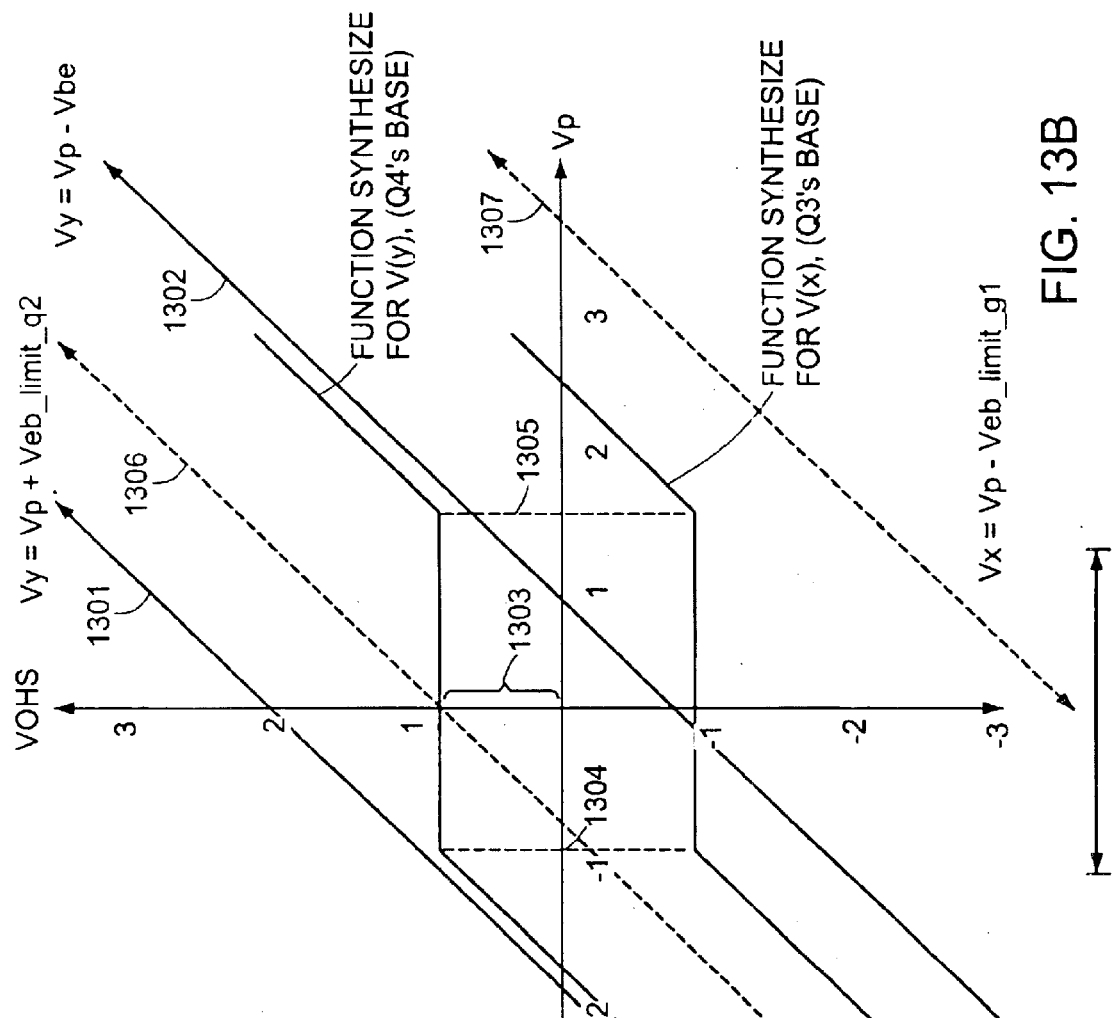
FIG. 13 is a graph of transfer functions of the clamp/boot strap circuits of FIGS. 11 and 12, with break points aligned.
Figure 13A:
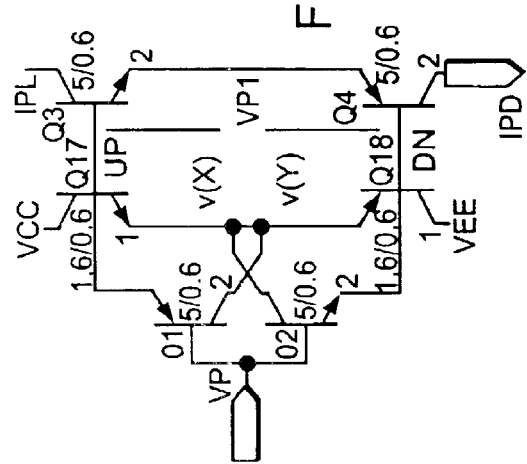

By suitably setting the threshold point for each of the sense stacks, and by selecting the offset voltage suitably, the transfer function of FIG. 13 can be achieved. Lines 1301 and 1302 indicate the acceptable operational limits of the voltages at $V_p$ and the base of transistor Q4. Therefore, allowing an offset 1303 for transistor Q4 $V_{be}$, the break points 1304 and 1305 are selected to keep the voltage at the base of Q4 within acceptable limits. Likewise, lines 1306 and 1307 define the acceptable limits for combinations of voltages $V_p$ and the voltage at the base of transistor Q3. Although the range of voltage $V_p$ between the limits may be different between transistors Q3 and Q4 because one is a PNP transistor and the other an NPN transistor, the $V_p$ break points 1308 and 1309 of the clamping and bootstrapping transfer function is aligned with $V_p$ for break points 1304 and 1305 so as to simplify the reference voltage and input structures of the two comparator circuits required. As a result, only one reference voltage $V_{RX}$ is required, and the simple sense stack structure of Q7, Q8, Q9, Q10, D1 and D2 provide an efficient circuit for controlling the modes as described.

In an alternative design, as discussed above, a single break point may be used, as shown in FIG. 14. The circuit topology to produce this single break point design is substantially the same as that which produces the two break point design discussed above. The transfer function selected may depend on the range of voltages over which protection is desired, the degree of cross-talk permitted, etc. One possible criteria is that clamping mode engage over the most common range of input voltages expected, while the transfer function overall is arranged to be achievable over the entire range of expected input voltages. It should be noted that a transfer function having two break points, such as illustrated in FIG. 13 is theoretically achievable for one input gain stage over any arbitrary range of input voltages, whereas the transfer function of FIG. 14 exceeds the acceptable reverse $V_{be}$ limit for voltages falling in the range 1410. Therefore, a transfer function as illustrated in FIG. 14 is only acceptable if the range of input voltages $V_p$ is constrained to be less than voltage 1411. Even using the transfer function illustrated in FIG. 13, a large enough input voltage will cause some stage of the input to break down. Input stages and their protection circuits can be cascaded to widen the range of protected and useful input voltages to any extent required in order to accommodate an anticipated range of input voltages.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. In a circuit having a stage that can be disabled, the stage having a first input and a second input and an output, the stage including a first transistor having a base, a collector and an emitter, a method comprising:

clamping one of the base and the emitter to a substantially constant voltage for a first range of voltages applied to the first input; and bootstrapping the one of the base and the emitter to a voltage related to the first input for a second range of voltages applied to the first input.

2. The method of claim 1, clamping further comprising:

applying a reference voltage through a series resistance to a buffer amplifier having an output connected to the one of the base and the emitter.

3. The method of claim 2, bootstrapping further comprising:

injecting a current into the series resistance, the injected current related to the voltage applied to the first input.

4. The method of claim 3, further comprising:

providing the series resistance by simulating a large resistor using an operational transconductance amplifier.

5. The method of claim 1, further comprising:

defining the first range of voltages and the fixed voltage so a reverse $V_{be}$ of the transistor never exceeds a voltage at which $\mu$-degradation is observable.

6. The method of claim 1, further comprising:

connecting the first input to the base of the first transistor through an active device;

connecting the second input to a base of a second transistor through another active device; and defining the output as a combination of the currents flowing in the first transistor and the second transistor;

wherein, when the circuit is disabled the output is reduced essentially to zero;

and wherein:

the first transistor and the second transistor both remain cutoff for all valid input voltages at the first input and the second input, and a maximum absolute difference in voltage between any two nodes of the circuit is controlled to limit or prevent damage to the transistors therein.

7. The method of claim 1, further comprising:

connecting the first input to the emitter of the first transistor through an active device;

connecting the second input to the emitter of a second transistor through an active device;

defining the output as a combination of the currents flowing in the first transistor and the second transistor;

wherein, when the circuit is disabled the output is reduced essentially to zero;

and wherein:

the first transistor and the second transistor both remain cutoff for all valid input voltages applied to the first input and the second input, and a maximum absolute difference between any two nodes of the circuit is controlled to limit or prevent damage to the transistors therein.

8. The method of claim 1, further comprising:

connecting the first input through a first impedance to the first transistor;

connecting the second input through a second impedance to a second transistor;

defining the output as a combination of currents flowing responsive to a voltage difference between the first input and the second input; and when disabled, holding the output at essentially zero for all valid input voltages applied to the first input and the second input.

9. A method of protecting a transistor having a base connected through a finite impedance to an input voltage, a collector and an emitter, the method comprising:

clamping one of the base and the emitter to a substantially constant voltage for a first range of voltages applied to the first input; and bootstrapping the one of the base and the emitter to a voltage related to the input voltage when the input voltage is within a second range of voltages.

10. A method as claimed in claim 9, clamping further comprising:

applying a reference voltage through a series resistance to a buffer amplifier having an output connected to the base.

11. The method of claim 10, bootstrapping further comprising:

injecting a current into the series resistance, the injected current related to the voltage applied to the one of the two input stages.

12. The method of claim 11, further comprising:

providing the series resistance by simulating a large resistor using an operational transconductance amplifier.

13. The method of claim 9, further comprising:

defining the first range of voltages and the fixed voltage so a reverse $V_{be}$ of the transistor never exceeds a voltage at which $\mu$-degradation is observable.

14. A circuit having an input voltage connected thereto, the circuit comprising:

a transistor having a base, a collector and an emitter;

a threshold circuit having an output and having an input connected to the input voltage;

an operational transconductance amplifier and buffer having an output and an input connected to the output of the threshold circuit; and a clamp buffer connected between the output of the operational transconductance amplifier and buffer and one of the base and the emitter of the transistors.

15. The circuit of claim 14, wherein the operational transconductance amplifier is connected to provide a series resistance between a reference voltage and the output of the operational transconductance amplifier and buffer.

16. The circuit of claim 15, further comprising:

a current mirror operatively connected between the output of the threshold circuit and the operational transconductance amplifier to mirror a variable current from the threshold structure into the series resistance provided by the operational transconductance amplifier.

17. In a circuit having a stage that can be disabled, the stage having an input and an output, the stage including a first transistor having a base, a collector and an emitter, a method comprising:

clamping one of the base and the emitter to a substantially constant voltage for a first range of voltages applied to the input;

bootstrapping the one of the base and the emitter to a voltage related to the input for a second range of voltages applied to the input;

connecting the input through a first impedance to the first transistor;

connecting the output through a second impedance to a second transistor; and wherein, when the circuit is disabled, the first transistor and the second transistor remain cut off for all valid voltages appearing at the input and the output.

18. In a circuit having a stage than can be disabled, the stage having a first input and a second input and an output, the stage including a transistor having a base, a collector, and an emitter, a method comprising:

clamping one of the base and the emitter to a substantially constant voltage for a first range of voltages applied across the two inputs; and bootstrapping the one of the base and the emitter to a voltage related to the first input for a second range of voltages applied across the inputs.

19. In a circuit having a stage than can be disabled, the stage having an input and an output, the stage including a first transistor having a base, a collector, and an emitter, a method comprising:

connecting the input through a first impedance to the first transistor;

connecting the output through a second impedance to a second transistor;

when disabled, the first transistor and the second transistor are held in a cut off regime for all valid voltages appearing at the input and the output, by:

clamping one of the base and the emitter to a substantially constant voltage for a range of voltages applied across the first input and the second input; and bootstrapping the one of the base and the emitter to a voltage related to the second input for a second range of voltages applied across the first input and the second input.

* * * * *

UNITED STATES PATENT AND TRADEMARK OFFICE
CERTIFICATE OF CORRECTION

| | | |
|---|---|---|
| PATENT NO. | : 6,844,768 B2 | Page 1 of 1 |
| APPLICATION NO. | : 10/441744 | |
| DATED | : January 18, 2005 | |
| INVENTOR(S) | : Jesse R. Bankman and Kimo Y. F. Tam | |

It is certified that error appears in the above-identified patent and that said Letters Patent is hereby corrected as shown below:

Please replace Figure 2 with the figure below, in which Q4 and Q6, which were originally depicted as NPN transistors, have been corrected to be PNP transistors.

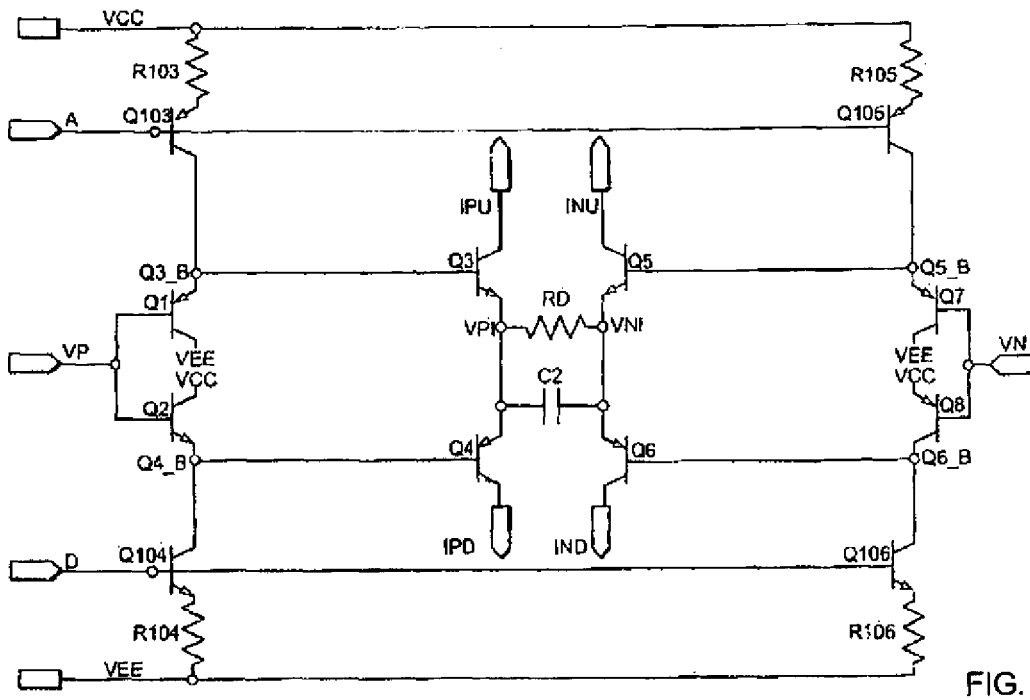

FIG. 2

Signed and Sealed this
Fifteenth Day of March, 2011

David J. Kappos
*Director of the United States Patent and Trademark Office*